United States Patent [19]
Negi

[11] Patent Number: 5,638,309
[45] Date of Patent: Jun. 10, 1997

[54] PSEUDO-RANDOM PATTERN GENERATING CIRCUIT

[75] Inventor: Keiji Negi, Tokyo, Japan

[73] Assignee: Ando Electric Co., Ltd., Tokyo, Japan

[21] Appl. No.: 493,310

[22] Filed: Jun. 21, 1995

[30] Foreign Application Priority Data

Jul. 15, 1994 [JP] Japan .................................. 6-186279

[51] Int. Cl.$^6$ ...................................................... G06F 1/02
[52] U.S. Cl. ............................................................ 364/717
[58] Field of Search ................................ 364/717, 717.5

[56] References Cited

U.S. PATENT DOCUMENTS

| | | | |
|---|---|---|---|
| 5,434,807 | 7/1995 | Yoshida | 364/717 |
| 5,444,645 | 8/1995 | Yoshida et al. | 364/717 |

FOREIGN PATENT DOCUMENTS 2163627  2/1986  United Kingdom .

OTHER PUBLICATIONS

ICC '79 Conference Record, International Conference on Communications, Boston, MA, vol. 1/4, Jun. 10–14, 1979, IEEE New York, NY, pp. 7.5.1–7.5.4, Krystyn Plewko, et al., "Generation and Properties of Pseudorandom Binary Sequences", Institute of Telecommunications, Warsaw, Poland.

*Primary Examiner*—Chuong D. Ngo
*Attorney, Agent, or Firm*—Finnegan, Henderson, Farabow, Garrett & Dunner, L.L.P.

[57] ABSTRACT

The present invention relates to pseudo-random pattern generating circuit for outputting pseudo-random patterns of a plurality of pseudo-random stages, characterized in comprising: a plurality of latch circuits for conducting delayed output of data input in synchrony with a clock input; a multiple input exclusive OR arithmetic circuit, an output of which is inputted into the aforementioned latch circuits; and a select circuit for selecting an output of the latch circuit and inputting this output as input data to the exclusive OR arithmetic circuit; wherein the select circuit switches an output to the exclusive OR arithmetic circuit according to an inputted select signal. In addition, it is also possible for the pseudo-random pattern generating circuit to further comprise a decoding circuit for converting an inputted pseudo-random selection signal to a select signal, and outputting this select signal.

4 Claims, 4 Drawing Sheets

PSEUDO-RANDOM PATTERN GENERATING CIRCUIT

BACKGROUND OF THE INVENTION

1. Field of the Invention

The present invention relates to a pseudo-random pattern generating circuit (hereinafter referred to as "PN pattern generating circuit"), and in particular to a PN pattern generating circuit which is capable of designating a plurality of PN stages, and outputting pseudo-random patterns for multiplexing (hereinafter referred to as "multiplex PN patterns") of a plurality of PN stages.

2. Relevant Art

FIG. 4 is a diagram showing a structure of a conventional PN pattern generating circuit. This circuit is a PN pattern generating circuit for multiplexing and is constructed from D-type flip-flop circuits (hereinafter referred to as "DFF circuits") 1-1~1-M, N:1 select circuits 10-1~10-M, multiplex PN pattern arithmetic circuits 11-1~11-N, etc. Furthermore, in FIG. 4, PN stage selection signal input terminal 5, multiplex PN pattern signal output terminal 6, and clock input terminal 7 are also provided.

Multiplex PN pattern arithmetic circuits 11-1~11-N are arithmetic circuits for use in different PN stages which input the output of DFF circuits 1-1~1-M, and compute and output the multiplex PN pattern of the subsequent time instant. In addition, select circuits 10-1~10-M select the output of multiplex PN pattern arithmetic circuits 11-1~11-N by means of the PN stage selection signal from PN stage selection signal input terminal 5. Furthermore, DFF circuits 1-1~1-M conduct re-timing of the outputs of N:1 select circuits 10-1~10-M, and output multiplex PN pattern signal.

FIG. 5 is a diagram showing an example of a PN pattern generating circuit which outputs a PN pattern of a single PN stage which is not for multiplexing. The PN pattern generating circuit shown in FIG. 5 is constructed from shift register comprising DFF circuits 42-1~42-N of n stages, and exclusive OR arithmetic circuit 43 which forms the feedback input thereof. Furthermore, in FIG. 5, a clock input terminal 40 and PN pattern output terminal 41 are also provided.

In addition, as shown in the aforementioned Figure, a respective character is assigned to each of DFF circuits 42-1~42-n beginning from the PN pattern output terminal 41 side, i.e., 1, 2, 3, . . . , i, . . . , m, n, and the output of the jth DFF circuit of a certain instant t is expressed by Qj(t). In this manner, since the shift register is formed from DFF circuits 42-1~42-n, output Qj(t+1) of jth DFF circuit at time instant (t+1) following one clock input to DFF circuits 42-1~42-n via clock input terminal 40 is expressed by the following Formula (1). Here, j≦m.

Formula (1)

$$Qj(t+1) = Qj+1(t)$$

In addition, the output of the nth DFF circuit 42-n at time instant t+1 is the exclusive OR of the 1st DFF circuit 42-1 and ith DFF circuit 42-i, and is hence expressed by the following Formula (2). Furthermore, "*" is the computation (arithmetic) conducted by means of exclusive OR arithmetic circuit 43.

Formula (2)

$$Qn(t+1) = Q1(t) * Qi(t)$$

Consequently, the PN pattern, Q1(t), Q1(t+1), Q1(t+2), . . . , is sequentially outputted from PN pattern output terminal 41. Accordingly, the PN pattern possesses a certain cycle. This cycle is determined by means of the stages n of the shift register and specifically comprises a (2n−1) clock. In this manner, the stages n of this shift register is referred to as "PN stage".

As a method for low-cost, high-speed output of PN patterns, methods are known in which the parallel PN pattern is outputted, or in which PN patterns are multiplexed using a multiplexing circuit which operates at an even higher speed and then outputted. The circuit for generating parallel PN patterns for this multiplexing is a multiplex PN pattern generating circuit, and the data outputted from this circuit corresponds to multiplex PN patterns. For example, a PN pattern generating circuit for M-multiplexing is constructed by means of M number of DFF circuits.

Thus, in order to prepare a data sequence formed from the aforementioned PN patterns Q1(t), Q1(t+1), . . . , for multiplexing, it is unnecessary to output in parallel this data sequence. If the number of PN patterns required for M-multiplexing is designated as "M", then the required data sequence is as follows.

Formula (3)

$$Q1(t), Q1(t+M), \ldots$$
$$Q1(t+1), Q1(t+M+1), \ldots$$
$$\ldots$$
$$Q1(t+M-1), Q1(t+2M+1), \ldots$$

These data sequences can be rewritten in the following manner by means of the aforementioned Formula (1), and thus a circuit is required for computing the states of each DFF circuit M clocks ahead.

Formula (4)

$$Q1(t), Q1(t+M), \ldots$$
$$Q2(t), Q2(t+M), \ldots$$
$$\ldots$$
$$QM(t), QM(t+M), \ldots$$

As an example of a circuit for computing the aforementioned state, an 8-multiplex PN pattern arithmetic circuit comprising seven stages is shown in FIG. 6. This circuit is constructed using exclusive OR arithmetic circuits 30-1 ~30-8. The output of DFF circuit is fed back and inputted into terminals 32-1 ~32-7 and the arithmetic results for the subsequent states of each DFF circuit are outputted from terminals 31-1~31-8.

FIG. 6 shows an example of a multiplex PN pattern arithmetic circuit comprising seven stages; when outputting other PN stages, a different PN pattern arithmetic circuit is required, however, the case of multiplex PN pattern arithmetic circuits for multiplexing other PN stages is similar and can be formed using only multiple-input exclusive OR arithmetic circuits. According to the conventional PN pattern generating circuit for outputting a plurality of PN stages, a structure was realized comprising a plurality of PN pattern arithmetic circuits for multiplexing wherein PN stage switching was conducted by means of switching the output therefrom using a select circuit.

For example, the PN pattern generating circuit shown in FIG. 4 outputs PN patterns of N types of PN stages and comprises N number of PN pattern arithmetic circuits 11-1~11-N. The outputs of these N number of PN pattern arithmetic circuits 11-1~11-N undergo PN stage switching in N:1 select circuits 10-1~10-M using the PN stage selection signals from PN stage selection signal input terminal 5.

In the conventional PN pattern generating circuit for outputting a plurality of PN stages, PN pattern arithmetic circuits corresponding to the number of PN stages to be outputted were provided, and the outputs of these PN pattern arithmetic circuits were switched by means of a select circuit such that the output of a plurality of PN stage patterns was possible.

However, according to the structure of this conventional PN pattern generating circuit, the number of PN pattern arithmetic circuits must be proportional to the number of PN stages to be outputted, and as a result, the gate scale is increased, thereby increasing the circuit scale as well. In addition, the fan-out of each DFF circuit is the overall sum of the fan-ins of each PN pattern arithmetic circuit. Thus, this value increases in proportion with the number of PN pattern arithmetic circuits. As a result, in consideration of the signal delay between DFF circuit and PN pattern arithmetic circuit, a buffer or the like must be inserted therein-between.

However, due to the addition of this buffer, high speed operation of PN pattern generating circuits is hindered according to the conventional PN pattern generating circuit.

SUMMARY OF THE INVENTION

In consideration of the aforementioned, it is an object of the present invention to provide a PN pattern generating circuit which operates at a high speed regardless of the number of PN stages to be outputted, and which solves the various problems present in the conventional Phi pattern generating circuits, i.e., increase in the PN pattern generating circuit scale in proportion to the number of PN stages to be outputted, reduction of the operational speed of PN pattern generating circuit due to increase in the fan-out of each DFF circuit, and the like.

In order to accomplish the aforementioned, the present invention provides a pseudo-random pattern generating circuit for outputting pseudo-random patterns of a plurality of PN stages, characterized in comprising:

a plurality of latch circuit means 1 for conducting delayed output of data input in synchrony with a clock input;

a multiple input exclusive OR arithmetic circuit means 2, an output of which is inputted into said latch circuit means 1; and a select circuit means 3 for selecting an output of said latch circuit means 1 and inputting said output as input data to said exclusive OR arithmetic circuit means 2;

wherein said select circuit means 3 switches an output to said exclusive OR arithmetic circuit means 2 according to an inputted select signal.

In addition, this pseudo-random pattern generating circuit may also further comprise a decoding circuit means 4 for converting an inputted PN selection signal to a select signal and outputting said select signal.

According to the PN pattern generating circuit of the present invention, PN stage switching is conducted by means of changing the select signal input to the select circuit. In this manner, a plurality of PN stage pseudo-random patterns are generated. Consequently, even in the case when the number of PN stages to be outputted increases, it is possible to cope with this situation by simply changing the selection of feedback signals from the latch circuit without changing the number of exclusive OR arithmetic circuits. As a result, the circuit scale is not proportional to the number of PN stages to be outputted; and additionally, even when at a maximum, the fan-out of latch circuits (DFF circuits) corresponds to the number of latch circuits (DFF circuits) regardless of the number of PN stages (i.e., fan-out is unrelated to the number of PN stages).

DETAILED DESCRIPTION OF THE PREFERRED EMBODIMENTS

Figure 1:
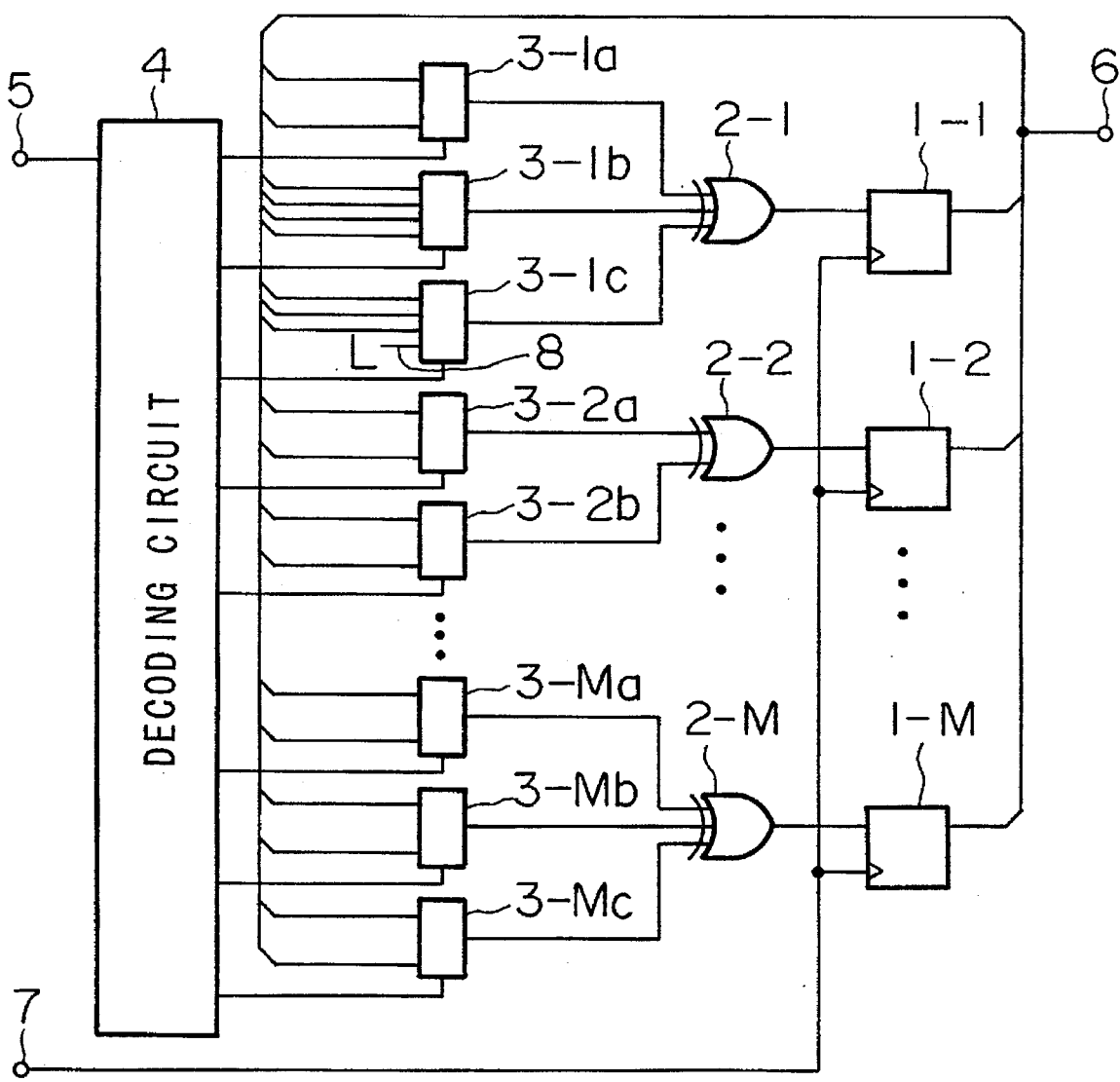
FIG. 1 is a circuit diagram showing a construction of a PN pattern generating circuit in accordance with a preferred embodiment of the present invention.

In the following, the preferred embodiments of the present invention will be explained with reference to the Figures. FIG. 1 is a diagram showing a structure of a preferred embodiment of the present invention. In this Figure, a PN pattern generating circuit of a plurality of PN stages is shown which comprises DFF circuits 1-1~1-M; exclusive OR arithmetic circuits 2-1~2-M; select circuits 3-1a~3-1c, 3-2a~3-2b, and 3-Ma~3-Mc; and decoding circuit 4. Furthermore, PN selection signal input terminal 5, multiplex PN pattern output terminal 6, clock input terminal 7, and low-level input terminal 8 are also provided in FIG. 1.

The multiplex PN pattern outputted from DFF circuits 1-1~1-M is inputted into select circuit 3. In select circuit 3, among all signals inputted, only signals required to compute the multiplex PN pattern are selected. Multiple input exclusive OR arithmetic circuit 2 then conducts exclusive OR arithmetic on the output of select circuit, and outputs the result for the subsequent state.

In this PN pattern generating circuit, the number of inputs of the multiple input exclusive OR arithmetic circuit 2 is described in the following. Specifically, the number of inputs of the multiple input exclusive OR arithmetic circuit 2 conforms to the number of inputs of the maximum exclusive OR arithmetic circuit in the PN pattern arithmetic circuit of the required PN stages. In other words, in the case of, for example, outputting a PN pattern of three PN stages, e.g., PN stages x, y, and z, the input D of each respective PN stage of a given DFF circuit is expressed as follows.

Formula (5)

At the time of PN stage x:

$$Dx = Q1(t) * Q2(t)$$

At the time of PN stage y:

$$Dy = Q2(t) * Q3(t) * Q4(t)$$

At the time of PN stage z:

$$Dz = Q1(t)$$

In the above case, as the exclusive OR arithmetic circuit connecting to the DFF circuit, since the exclusive OR of three inputs serves as a maximum at the time of PN stage y, a three-input exclusive OR arithmetic circuit is required.

In the following, the input signal of select circuit 3 and decoding circuit 4 will be explained in greater detail. The signal to be inputted into select circuit 3 is common to the feedback signal of each PN stage, and does not exceed the number of DFF circuits M, even in the case when the fan-out of each DFF circuit reaches a maximum. In other words, the output of a given DFF circuit connects to only one select circuit among select circuits connecting to the exclusive OR arithmetic circuit.

This aspect will be explained with regard to the case of the aforementioned Formula (5). In the case when the input of each PN stage of a given DFF circuit is expressed by means of Formula (5), the input D of this DFF circuit can be expressed by means of the following Formula (6).

Formula (6)

$$\begin{aligned} D &= DX \cdot Sx + Dy \cdot Sy + Dz \cdot Sz \\ &= \{Q1(t) * Q2(t)\} \cdot Sx + \\ & \quad \{Q2(t) * Q3(t) * Q4(t)\} \cdot Sy + \\ & \quad Q1(t) \cdot Sz \end{aligned}$$

Wherein "·" and "+" respectively represent the logical product and logical sum

At the time of PN stage x: Sx=1, Sy=0, Sz=0
At the time of PN stage y: Sx=0, Sy=1, Sz=0
At the time of PN stage z: Sx=0, Sy=0, Sz=1

In the above-described Formula (5), Q1(t) is required for the arithmetic at the time of PN stages x and z; while Q2(t) is required at the time of PN stages x and y. As a result, Q1(t) and Q1(t) exhibit a common nature, and hence Formula (6) can also be expressed in the following manner.

Formula (7)

$$D = Q1(t) \cdot S1 * Q2(t) \cdot S2 * Q3(t) \cdot S3 * Q4(t) \cdot S4$$

(In the formula, S1=Sx+Sz, S2=Sx+Sy, S3=Sy, S4=Sy)

Figure 2:
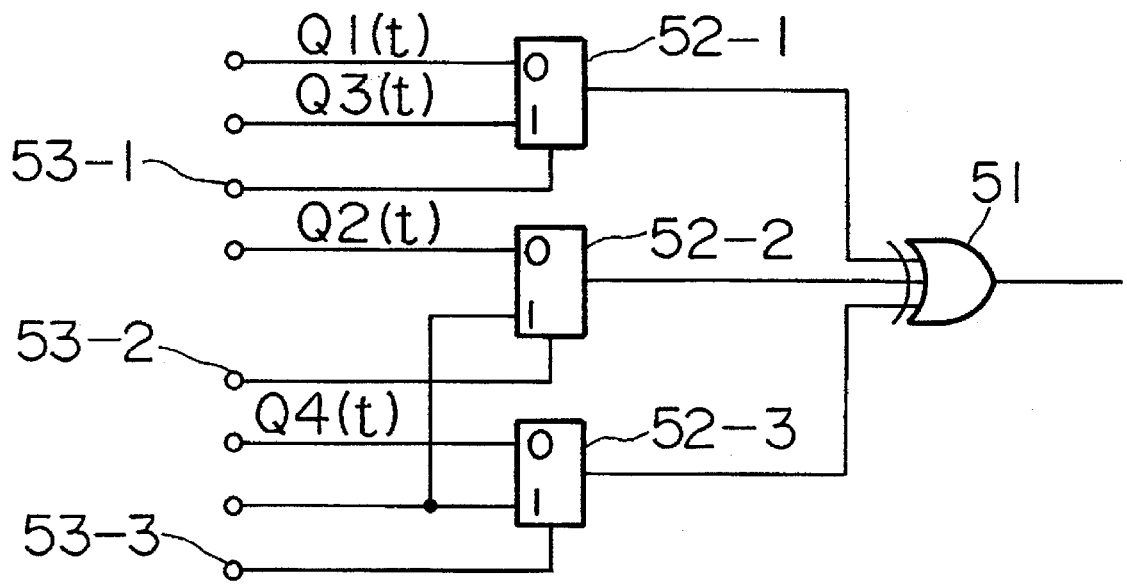
FIG. 2 is a circuit diagram showing a construction of a multiple input exclusive OR arithmetic circuit and select circuit which comprise the PN pattern generating circuit shown in FIG. 1.

The circuit diagram of the aforementioned is shown in FIG. 2. In the circuit shown in FIG. 2, an input exclusive OR arithmetic circuit 51, select circuits 52-1~52-3, selection signal input terminals 53-1~53-3 of the aforementioned select circuits, and low-level input terminal 54 are provided. According to this circuit, an exclusive OR arithmetic (computation) of three signals is conducted at the time of PN stage y. However, at the time of PN stage x or z, low level 54 is inputted into one input of the select circuit without conducting the above three-signal exclusive OR arithmetic, and an exclusive OR arithmetic of three signals or less is then conducted. Furthermore, the above-mentioned low level 54 corresponds to the low level input from low level input terminal 8 shown in FIG. 1.

Accordingly, in this circuit, at the time when PN stage x is outputted, select signal 53-1 of select circuit 52-1 is 0, select signal 53-2 of select circuit 52-2 is 0, and select signal 53-3 of select circuit 52-3 is 1. In the same manner, at the time when PN stage y is outputted, select signal 53-1 is 1, select signal 53-2 is 0, and select signal 53-3 is 0. Furthermore, at the time when PN stage z is outputted, select signal 53-1 is 0, select signal 53-2 is 1, and select signal 53-3 is 1.

As described above, since Q1(t) and Q2(t) are formed in common, the select inputs are not all uniform. At this point, the PN selection signal must be converted into select signals for each select circuit; in this manner, the circuit structure of FIG. 1 comprises a decoding circuit 4 for converting PN stage selection signals from the PN stage selection signal input terminals 5 to select signals for each of the select circuits.

Figure 3:
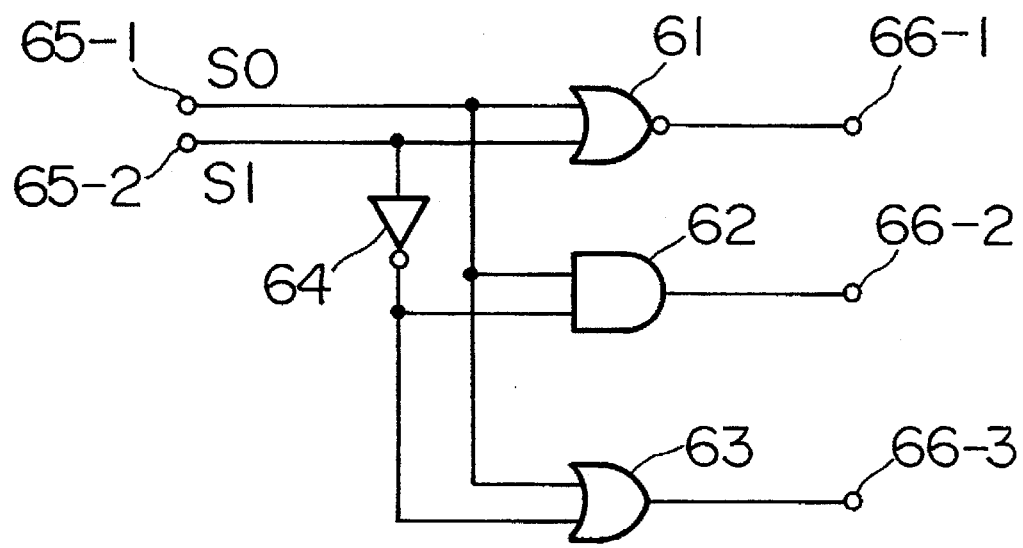
FIG. 3 is a circuit diagram showing a construction of a decoding circuit which comprises the PN pattern generating circuit shown in FIG. 1.
Figure 4:
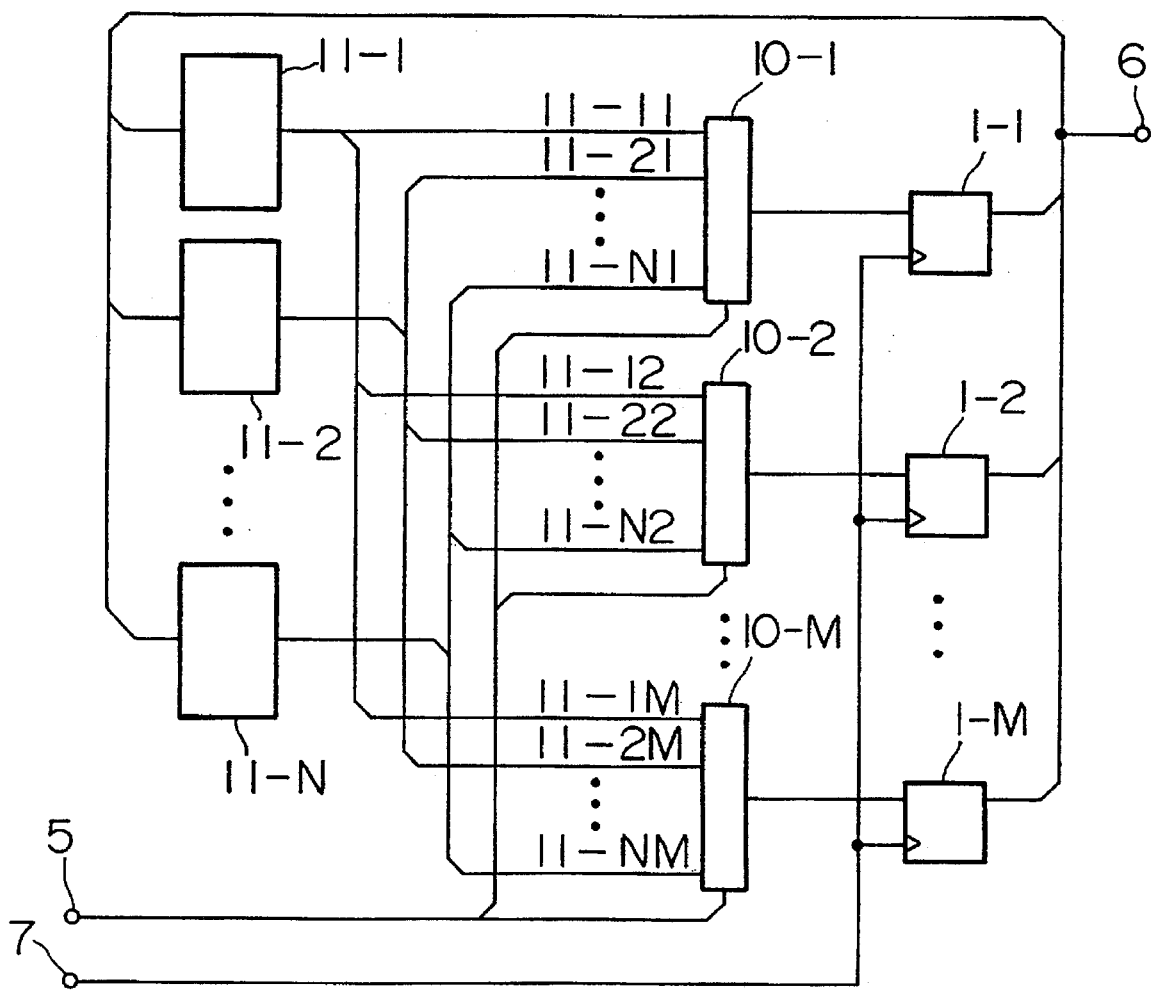
FIG. 4 is a circuit diagram showing a construction of a conventional PN pattern generating circuit.
Figure 5:
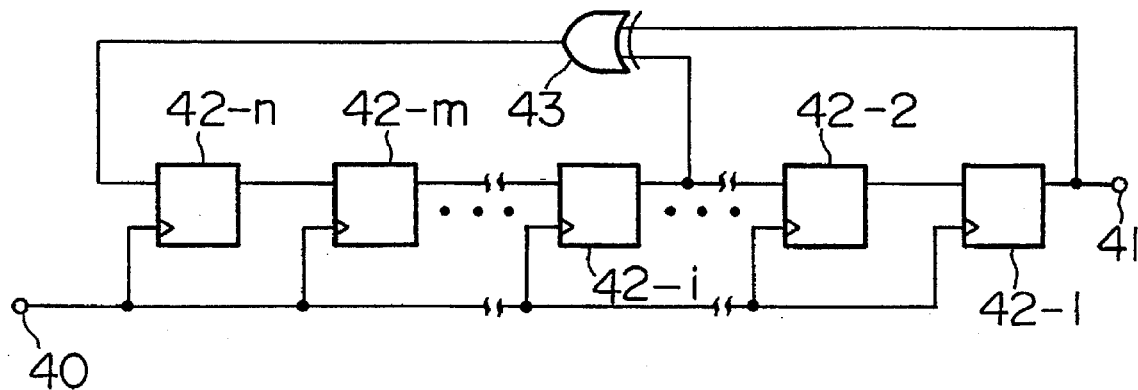
FIG. 5 is a circuit diagram of a PN pattern generating circuit for outputting the PN pattern of a single PN stage.
Figure 6:
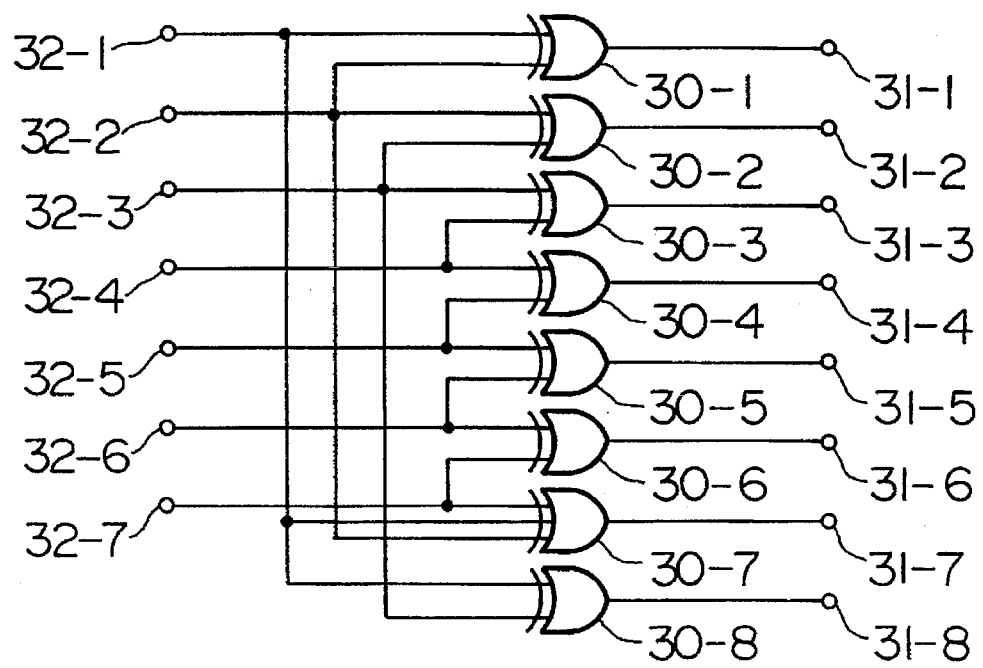
FIG. 6 is a circuit diagram showing an example of a PN pattern arithmetic circuit comprising the PN pattern generating circuit shown in FIG. 4.

As shown in FIG. 3, this decoding circuit 4 comprises NOR arithmetic circuit 61, AND arithmetic circuit 62, OR arithmetic circuit 63, reverse component 64, input terminals 65-1~65-2 of PN selection signals S0 and S1, and select signal output terminals 66-1~66-3 to the select circuit. This decoding circuit 4, for example, in the case of the PN pattern arithmetic circuit shown in FIG. 2, outputs the select signals of each select circuit at the time when PN selection signals S1 and S0 are respectively 0 and 0 at the time of PN stage x; PN selection signals S1 and S0 are respectively 0 and 1 at the time of PN stage y; and when PN selection signals S1 and S0 are respectively 1 and 0 at the time of PN stage z.

Furthermore, according to the decoding circuit 4 shown in FIG. 3, select signal output terminal 66-1 is connected to select signal input terminal 53-1 of select circuit 52-1 shown in FIG. 2. In the same manner, select signal output terminal 66-2 and select signal output terminal 65-3 are respectively connected to select signal input terminal 53-2 and select signal input terminal 53-3. According to this structure, it is possible to designate each select circuit by means of PN selection signals S0 and S1 from input terminals 65-1~65-2.

According to the present invention, upon manufacturing a PN pattern generating circuit for outputting the PN patterns of 9 types of PN stages, it was found that the circuit scale was reduced by approximately 50%, with an approximate 20% increase in the operational speed over a PN pattern generating circuit comprising a conventional circuit structure.

Effects of the Invention

According to the present invention, it is possible to generate pseudo-random patterns of a plurality of PN stages by means of switching PN stages by changing the select signal input to the select circuits. Therefore, even in the case when the number of PN stages increases, there is no change in the number of exclusive OR arithmetic circuits.

Consequently, even when the number of PN stages increases, it is possible to provide a PN pattern generating circuit in which the operational speed does is not reduced, and wherein there is no change in the circuit scale from the number of PN stages to be outputted or change in the fan-out of the DFF circuit (latch circuit).

What is claimed is:

1. A pseudo-random pattern generating circuit for outputting pseudo-random patterns of a plurality of pseudo-random stages, comprising:

a plurality of latch circuit means for conducting delayed outputs of data inputs in synchrony with a clock input;

a plurality of multiple input exclusive OR arithmetic circuit means respectively corresponding to said plurality of latch circuit means, an output of each said multiple input exclusive OR arithmetic circuit means being inputted to said corresponding latch circuit means; and a plurality of select circuit means for selecting a signal for input to a corresponding exclusive OR arithmetic circuit means from the output of the plurality of latch circuit means.

2. A pseudo-random pattern generating circuit according to claim 1, further comprising:

a decoding circuit means for converting an inputted pseudo-random selection signal to a select signal, and outputting said select signal.

3. A pseudo-random pattern generating circuit according to claims 1 or 2, wherein said latch circuit means is a D-type flip-flop circuit.

4. A pseudo-random pattern generating circuit according to claims 1 or 2, wherein said plurality of select circuit means select a signal for input to a corresponding exclusive OR arithmetic circuit in response to the receipt of a select signal.

* * * * *

UNITED STATES PATENT AND TRADEMARK OFFICE
CERTIFICATE OF CORRECTION

PATENT NO. : 5,638,309
DATED : June 10, 1997
INVENTOR(S) : Keiji NEGI

It is certified that error appears in the above-indentified patent and that said Letters Patent is hereby corrected as shown below:

In claim 1, column 6, lines 48-49, "a signal for input to a corresponding" should read --corresponding signals to input to each--.

In claim 4, column 6, line 62, "a signal for input to a corresponding" should read --corresponding signals to input to each--.

Signed and Sealed this

Twenty-eighth Day of October, 1997

Attest:

BRUCE LEHMAN

Attesting Officer

Commissioner of Patents and Trademarks